United States Patent [19]

Hörold et al.

[11] Patent Number: 5,830,973
[45] Date of Patent: Nov. 3, 1998

[54] PHOSPHORUS-MODIFIED EPOXY RESINS COMPRISING EPOXY RESINS AND PHOSPHORUS-CONTAINING COMPOUNDS

[75] Inventors: Sebastian Hörold, Erftstadt; Hans-Peter Schmitz, Brühl, both of Germany

[73] Assignee: Hoechst Aktiengesellschaft, Frankfurt, Germany

[21] Appl. No.: 824,991

[22] Filed: Mar. 27, 1997

[30] Foreign Application Priority Data

Apr. 1, 1996 [DE] Germany .................. 196 13 061.1

[51] Int. Cl.$^6$ .................. C08G 59/30; C08G 59/40
[52] U.S. Cl. .................. 528/108; 525/523; 528/398; 528/400; 428/413
[58] Field of Search .................. 525/523; 528/108, 528/398, 400; 428/413

[56] References Cited

U.S. PATENT DOCUMENTS

| | | | |
|---|---|---|---|
| 3,334,110 | 8/1967 | Schramm | 260/307 |
| 3,378,526 | 4/1968 | Vogt et al. | 528/108 |
| 3,477,982 | 11/1969 | Dijkstra et al. | 260/37 |
| 4,138,433 | 2/1979 | Kleiner et al. | 260/545 P |
| 4,289,812 | 9/1981 | Martin | 427/379 |
| 5,364,893 | 11/1994 | von Gentzkow et al. | 523/429 |

FOREIGN PATENT DOCUMENTS

| | | |
|---|---|---|
| 2158361 | 9/1994 | Canada . |
| 0384939 | 9/1990 | European Pat. Off. . |
| 1570439 | 9/1969 | Germany . |
| 1745796 | 3/1972 | Germany . |
| 2528420 | 1/1977 | Germany . |
| 265007 | 5/1978 | Germany . |
| 2652052 | 5/1978 | Germany . |
| 2757733 | 7/1978 | Germany . |
| 3540524 | 5/1987 | Germany . |
| 4308185 | 9/1994 | Germany . |

OTHER PUBLICATIONS

*Lackkunstharze* (Wagner/Sarx), 5th ed., Carl Hanser Verlag (1971), pp. 174–194.

Bald, G., et al, *Angewandte Makromol. Chem.* 44:151–163 (1975).

Chemical Abstract, vol. 108, May 2, 1988 "Flame–retardant polyester–epoxy adhesive compositions".

Chemical Abstract, vol. 70, Jun. 30, 1969, "Epoxy–foams preparation with boron compound as hardeners".

*Primary Examiner*—Frederick Krass
*Attorney, Agent, or Firm*—Miles B. Dearth

[57] ABSTRACT

The invention relates to a phosphorus-modified epoxy resin having an epoxide value of from 0 to 1.0 mol/100 g, comprising structural units derived from (A) polyepoxide compounds having at least two epoxide groups per molecule and (B) diphosphinic acids, to a process for their preparation and to their use.

5 Claims, No Drawings

PHOSPHORUS-MODIFIED EPOXY RESINS COMPRISING EPOXY RESINS AND PHOSPHORUS-CONTAINING COMPOUNDS

The present invention relates to phosphorus-modified epoxy resins, to a process for their preparation and to their use.

Epoxy resins are employed nowadays to produce molding compositions and coatings having good thermal, mechanical and electronic properties. They are suitable for encapsulating electrical and electronic components and for soak and impregnation processes. In electrical engineering, the epoxy resin molding compositions used are predominantly treated for flame resistance.

Epoxy resin molding compositions are generally treated for flame resistance using bromine-containing aromatic compounds, especially tetrabromobisphenol A. If exclusively brominated flameproofing agents are employed, then a bromine content of about 20% is required in order to ensure that the molding compositions are self-extinguishing. As a synergist, antimony trioxide is used in many cases. In the event of fire, hydrogen bromide is given off, which can lead to corrosion damage. Under adverse conditions, it is also possible for polybrominated dibenzodioxins and furans to be formed. There is therefore a need for epoxy resin molding compositions which achieve the required flame resistance without the addition of brominated compounds.

For the flame-resistant treatment of epoxy resin molding compositions, fillers having an extinguishing action, such as aluminum oxide hydrate (DE-A-35 40 524), have been proposed. The addition of ammonium polyphosphate, alone or in combination with aluminum oxide hydrate, can also achieve adequate flame resistance. Instead of ammonium polyphosphate it is also possible to use red phosphorus (DE-A-17 45 796).

A disadvantage with all flameproofing agents present as filler is that the materials obtained are not transparent. Numerous liquid organophosphorus compounds have already been proposed as flame-retarding plastics additives. A disadvantage with these systems, however, is a pronounced "plasticizer effect" of these additives. In the case of cured epoxy resins, the plasticizing effect is manifested in a sharp reduction in the glass transition temperature.

Also known in the literature are phosphorus-modified epoxy resins which are obtained by reacting polyepoxide compounds with anhydrides of phosphonic acids or phosphinic acids and which are notable for good flame resistance properties (DE-A-43 08 185).

The flame-resistant treatment of epoxy resins with expoxide-functional phosphonic esters has already been described (EP-A-0 384 939). A disadvantage with these systems is the high complexity of synthesizing such phosphonic esters.

The object of the present invention is to provide a flame-resistant epoxy resin which is easy to handle and can be prepared in a simple manner.

This object is achieved by a phosphorus-modified epoxy resin having an epoxide value of from 0 to 1.0 mol/100 g, comprising structural units derived from (A) polyepoxide compounds having at least two epoxide groups per molecule and (B) diphosphinic acids.

The epoxide value of the phosphorus-modified epoxy resin is preferably from 0 to 0.6 mol/100 g.

Another feature of the novel phosphorus-modified epoxy resin is that the diphosphinic acids are of the formula (I)

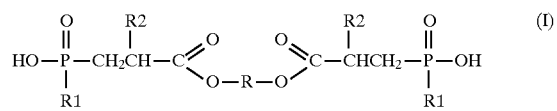

in which

R1 is an alkyl or aryl group of 1 to 10 carbon atoms, R2 is hydrogen or an alkyl group of 1 to 4 carbon atoms, and R is an alkylene, cycloalkylene or arylene group of 2 to 20 carbon atoms.

The phosphorus content is preferably from 0.5 to 9% by weight, based on the epoxy resin.

The phosphorus-modified epoxy resin preferably contains on average at least one epoxide group.

The present object is likewise achieved by a process for preparing phosphorus-modified epoxy resins from an epoxy resin and a phosphorus-containing compound of formula (I), which comprises reacting the polyepoxide compound of (A) and the diphosphinic acid of (B) with one another.

The reaction preferably takes place in a solvent.

Preference is given to employing aprotic polar solvents such as N-methylpyrrolidone, dimethylformamide, tetrahydrofuran, dioxane, dialkyl ethers, glycol ethers, ketones and/or esters.

Other preferred solvents employed are halogenated hydrocarbons, aliphatic, cycloaliphatic and/or aromatic hydrocarbons, individually or as mixtures.

The reaction preferably takes place at temperatures of between −10° and +200° C.

The reaction particularly preferably takes place at temperatures of from 70° to 130° C.

The ratio of equivalents between polyepoxide compound (A) and diphosphinic acid (B) is preferably from 1:0.1 to 1:1.

The invention also relates to the use of the novel phosphorus-modified epoxy resins to produce moldings, coatings or laminates.

Finally, the invention relates to moldings, coatings or laminates produced using the novel phosphorus-modified epoxy resins.

The novel phosphorus-modified epoxy resins are notable for good storage stability, even in solution, melting ranges of from 70° to 100° C. and glass transition temperatures of above 40° C., and are therefore also highly suitable for producing laminates by way of so-called prepregs.

In the novel preparation of the phosphorus-modified epoxy resins, a polyepoxide compound having at least two epoxide groups per molecule and a 2,5-dioxo-1,2-oxaphospholane of the formula (II)

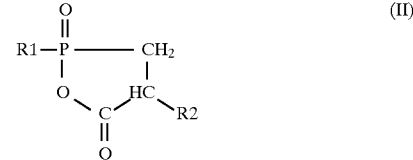

in which R1 and R2 are as defined for formula (I), are introduced as an initial charge which is heated until a homogeneous melt has formed. Then a diol of the formula HO—R—OH (III) in which R is as defined for formula (I) is added dropwise. Alternatively, the diol can also be added directly thereto. The diol and the 2,5-dioxo-1,2-oxaphospholane together produce a diphosphinic acid of formula (I), which enters directly, by reaction, into the epoxy resin.

The diol of formula (III) that is used can, for example, be ethylene glycol, propanediol, butanediol, cyclohexanediol, resorcinol or hydroquinone.

The preparation of the 2,5-dioxo-1,2-oxaphospholane of formula (II) can be carried out, as described in DE-A-25 28 420, from dihalophosphines and an unsaturated carboxylic acid with subsequent elimination of chlorine, for example by water or acetic acid.

The halogen-free epoxide compounds employed in accordance with the invention (also referred to below as polyepoxide compounds) can be saturated or unsaturated and can be aliphatic, cycloaliphatic, aromatic and/or heterocyclic. They may, furthermore, include those substituents which do not give rise, under the conditions of mixing or of reaction, to disruptive side reactions, examples being alkyl or aryl substituents, ether groups or the like. It is also possible to use mixtures of different polyepoxide compounds. The mean molecular weight $M_n$ of these polyepoxide compounds can be up to about 9000, but is generally from about 150 to 4000.

These polyepoxide compounds are, for example, polyglycidyl ethers based on polyhydric, preferably dihydric, alcohols, phenols, hydrogenation products of these phenols and/or on novolaks (reaction products of mono- or polyhydric phenols, such as phenol and/or cresols, with aldehydes, especially formaldehyde in the presence of acidic catalysts), that are obtained in a known manner, for example by reacting the respective polyols with epichlorohydrin.

Polyhydric phenols which may be mentioned here by way of example are: resorcinol, hydroquinone, 2,2-bis(4-hydroxyphenyl)propane (bisphenol A), isomer mixtures of dihydroxydiphenylmethane (bisphenol F), 4,4'-dihydroxydiphenylcyclohexane, 4,4'-dihydroxy-3,3'-dimethyldiphenylpropane, 4,4'-dihydroxybiphenyl, 4,4'-dihydroxybenzophenone, 1,1-bis(4-hydroxyphenyl)ethane, 1,1'-bis(4-hydroxyphenyl)isobutane, 2,2-bis(4-hydroxy-tert-butylphenyl)propane, bis(2-hydroxynaphthyl)methane, 1,5-dihydroxynaphthalene, tris(4-hydroxyphenyl)methane, 1,1'-bis(4-hydroxyphenyl) ether. Bisphenol A and bisphenol F are preferred in this context.

Also suitable as polyepoxide compound are the polyglycidyl ethers of polyhydric aliphatic alcohols. Examples of such polyhydric alcohols that may be mentioned are 1,4-butanediol, 1,6-hexanediol, polyalkylene glycols, glycerol, trimethylolpropane, 2,2-bis (4-hydroxycyclohexyl)propane and pentaerythritol.

Further suitable polyepoxide compounds are (poly)glycidyl esters which are obtained by reacting epichlorohydrin or similar epoxy compounds with an aliphatic, cycloaliphatic or aromatic polycarboxylic acid such as oxalic acid, adipic acid, glutaric acid, phthalic, isophthalic, terephthalic, tetrahydrophthalic or hexahydrophthalic acid, 2,6-naphthalenedicarboxylic acid and dimerized fatty acids. Examples hereof are glycidyl terephthalate and diglycidyl hexahydrophthalate.

Polyepoxide compounds which comprise the epoxide groups in random distribution along the molecule chain and which can be prepared by emulsion copolymerization using olefinically unsaturated compounds containing these epoxide groups, for example glycidyl esters of acrylic or methacrylic acid, can be employed with advantage in some cases. Examples of further polyepoxide compounds which can be used are those based on heterocyclic ring systems, for example hydantoin epoxy resins, triglycidyl isocyanurate and/or its oligomers, triglycidyl-p-aminophenol, triglycidyl-p-aminodiphenyl ether, tetraglycidyldiaminodiphenylmethane, tetraglycidyldiaminodiphenyl ether, tetrakis(4-glycidyloxyphenyl)ethane, urazole epoxides, uracil epoxides, and oxazolidinone-modified epoxy resins.

Other polyepoxides based on aromatic amines, such as aniline, examples being N,N-diglycidylaniline, diamino-diphenylmethane and N,N'-dimethylaminodiphenylmethane or N,N'-dimethylaminodiphenyl sulfone. Other suitable polyepoxide compounds are described in "Handbook of Epoxy Resins" by Henry Lee and Kris Neville, McGraw-Hill Book Company, 1967, in the monograph by Henry Lee "Epoxy Resins", American Chemical Society, 1970, in Wagner/Sarx, "Lackkunstharze", Carl Hanser Verlag (1971), 5th edition, 174 ff., in "Angew. Makromol. Chemie", Vol. 44 (1975), pages 151 to 163, in DE-A-27 57 733 and in EP-A-0 384 939, which are incorporated by reference here.

Polyepoxide compounds that are employed with preference are bisglycidyl ethers based on bisphenol A, bisphenol F and bisphenol S (reaction products of these bisphenols and epichloro(halo)hydrin) or oligomers thereof, polyglycidyl ethers of phenol-formaldehyde and/or cresol-formaldehyde novolaks, and also diglycidyl esters of phthalic, isophthalic, terephthalic, tetrahydrophthalic and/or hexahydrophthalic acid and of trimellitic acid, N-glycidyl compounds of aromatic amines and heterocyclic nitrogen bases, such as N,N-diglycidylaniline, N,N,O-triglycidyl-p-aminophenol, triglycidyl isocyanurate and N,N,N',N'-tetraglycidylbis(p-aminophenyl)methane, hydantoin epoxy resins and aracid epoxy resins, and also di- and polyglycidyl compounds of polyhydric aliphatic alcohols, such as 1,4-butanediol, trimethylolpropane and polyalkylene glycols.

Furthermore, oxazolidinone-modified epoxy resins are also suitable. Compounds of this kind are already known (see: "Angew. Makromol. Chem.", vol. 44 (1975), pages 151 to 163, and also U.S. Pat. No. 3,334,110); an example thereof which may be mentioned is the reaction product of bisphenol A diglycidyl ether with diphenylmethane diisocyanate (in the presence of an appropriate accelerator). In connection with the preparation of the novel coating composition, the polyepoxy resins can be present individually or in a mixture.

The term "curing" as used herein denotes the conversion of the soluble, meltable polyepoxides to solid, insoluble and infusible, three-dimensionally crosslinked products, generally with simultaneous shaping to form, for instance, impregnated structures, coatings and adhesive bonds.

Hardeners (curing agents) which can be employed are, for example, aliphatic, cycloaliphatic, aromatic and heterocyclic amines, such as bis(4-aminophenyl)methane, aniline-formaldehyde resins, bis(4-aminophenyl) sulfone, ethylenediamine, 1,3-propanediamine, hexamethylenediamine, diethylenetriamine, triethylenetetramine, 2,2,4-trimethylhexane-1,6-diamine, m-xylylenediamine, bis(4-aminocyclohexyl)methane, 2,2-bis(4-aminocyclohexyl)propane, 3-aminomethyl-3,5,5-trimethylcyclohexylamine (isophoronediamine), polyamidoamines, polyphenols, such as hydroquinone, resorcinol, 2,2-bis(4-hydroxyphenyl)propane (bisphenol A) and phenol-aldehyde resins, polycarboxylic acids and their anhydrides, for example phthalic anhydride, tetrahydrophthalic anhydride, hexahydrophthalic anhydride, and pyromellitic dianhydride. It is also possible, furthermore, to use catalytic curing agents, such as cyanoguanidines, or Friedel-Crafts catalysts, such as boron trifluoride.

If amines are used as curing agents, then they are normally employed in an amount of from 0.75 to 1.25 equivalents per epoxide equivalent. In the case of polycarboxylic acids or their anhydrides, from 0.4 to 1.1 equivalents are used per epoxide equivalent.

Suitable accelerators are principally imidazole derivatives, examples being 2-methylimidazole, 2-phenylimidazole and 2-heptadecylimidazole; also suitable are phosphines, metal soaps and acetylacetonates.

Examples of suitable reactive diluents are mono- or polyfunctional alcohols of low molecular mass which are reacted with epichlorohydrin.

By varying the ratio of equivalents of polyepoxide compound to diphosphinic acid of formula (I) it is possible to adjust the phosphorus content of the novel resin. The ratio of equivalents is preferably between 1:0.1 and 1:0.8 and, with particular preference, between 1:0.1 and 1:0.4. By reacting the epoxy resin with a phosphorus-containing dicarboxylic acid or a phosphorus-containing carboxylic anhydride, a phosphorus-modified epoxy resin is obtained which is still meltable and/or soluble and which is stable on storage, optionally even in solution, and is easy to handle.

Suitable solvents for the process are, for instance, N-methylpyrrolidone, dimethylformamide, ethers, such as diethyl ether, tetrahydrofuran, dioxane, ethylglycol ethers, propylene glycol ethers, butylglycol ethers of monoalcohols having an optionally branched alkyl radical of 1 to 6 carbon atoms.

Examples of other solvents are ketones, for instance acetone, methyl ethyl ketone, methyl isopropyl ketone, methyl isobutyl ketone, cyclohexanone and the like, although esters, such as ethyl acetate, butyl acetate, ethylene glycol acetate and methoxypropyl acetate, can also be employed.

Other suitable solvents are halogenated hydrocarbons and also cycloaliphatic and/or aromatic hydrocarbons, among which preference is given to hexane, heptane, cyclohexane, toluene and dixylenes. It is possible to employ these solvents individually or in a mixture.

The epoxy resin molding compositions are preferably reinforced by means of glass cloth or glass fibers. The epoxy resin molding compositions can also be equipped with fillers such as quartz flour or aluminum oxide hydrate.

The novel epoxy resin molding compositions can be used for surface coating. They can be used for encapsulating electrical components, for laminates and for adhesives.

The invention is illustrated below by way of examples. In the examples, a phosphorus compound of formula (IV) was used:

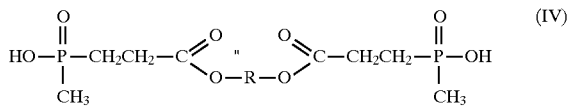

EXAMPLE 1

147 g of a bisphenol A bisglycidyl ether having an epoxide value of 0.55 mol/100 g and 54 g of 2-methyl-2,5-dioxo-1,2-oxaphospholane (0.4 mol) are charged to a 500 ml five-necked flask fitted with stirrer shaft, dropping funnel, reflux condenser and thermometer, and the mixture is heated at 110° C. with stirring. 12.6 g of ethylene glycol (0.2 mol) are added dropwise at 110° C. over the course of 30 minutes. After stirring at 110° C. for 30 minutes more, a clear solution is obtained. Stirring is continued at this temperature for 2 h and at 130° C. for one hour. A colorless epoxy resin is obtained which is solid at room temperature and has an epoxide value of 0.16 mol/100 g and a phosphorus content of 5.7% by weight.

EXAMPLE 2

147 g of a bisphenol A bisglycidyl ether having an epoxide value of 0.55 mol/100 g and 54 g of 2-methyl-2,5-dioxo-1,2-oxaphospholane (0.4 mol) in 54 ml of methyl ethyl ketone are charged to a 500 ml five-necked flask fitted with stirrer shaft, dropping funnel, reflux condenser and thermometer, and the mixture is heated at 80° C. with stirring. 12.6 g of ethylene glycol (0.2 mol) are added dropwise over the course of 30 minutes. After stirring for 30 minutes more, a clear solution is obtained. Stirring is continued at 80° C. for 5 h. An 80% strength by weight solution is obtained of a colorless epoxy resin which has an epoxide value of 0.13 mol/100 g and a phosphorus content of 4.6% by weight.

EXAMPLE 3

124 g of a bisphenol A bisglycidyl ether having an epoxide value of 0.55 mol/100 g and 46 g of 2-methyl-2,5-dioxo-1,2-oxaphospholane (0.34 mol) are charged to a 500 ml five-necked flask fitted with stirrer shaft, dropping funnel, reflux condenser and thermometer, and the mixture is heated at 110° C. with stirring. 12.9 g of 1,3-propanediol (0.17 mol) are added dropwise at 110° C. over the course of 30 minutes. After stirring at 110° C. for 30 minutes more, a clear solution is obtained. Stirring is continued at this temperature for 2 h and at 130° C. for one hour. A colorless epoxy resin is obtained which is solid at room temperature and has an epoxide value of 0.19 mol/100 g and a phosphorus content of 5.8% by weight.

EXAMPLE 4

123 g of a bisphenol A bisglycidyl ether having an epoxide value of 0.55 mol/100 g and 45 g of 2-methyl-2,5-dioxo-1,2-oxaphospholane (0.34 mol) are charged to a 500 ml five-necked flask fitted with stirrer shaft, dropping funnel, reflux condenser and thermometer, and the mixture is heated at 110° C. with stirring. 18 g of diethylene glycol (0.17 mol) are added dropwise at 110° C. over the course of 30 minutes. After stirring at 110° C. for 30 minutes more, a clear solution is obtained. Stirring is continued at this temperature for 2 h and at 130° C. for one hour. A colorless epoxy resin is obtained which is solid at room temperature and has an epoxide value of 0.21 mol/100 g and a phosphorus content of 5.6% by weight.

EXAMPLE 5

102 g of a bisphenol A bisglycidyl ether having an epoxide value of 0.55 mol/100 g and 38 g of 2-methyl-2,5-dioxo-1,2-oxaphospholane (0.28 mol) are charged to a 500 ml five-necked flask fitted with stirrer shaft, dropping funnel, reflux condenser and thermometer, and the mixture is heated at 110° C. with stirring. 15.5 g of hydroquinone (0.14 mol) are then added. After stirring at 110° C. for 30 minutes, a clear solution is obtained. Stirring is continued at this temperature for 2 h and at 130° C. for one hour. A colorless epoxy resin is obtained which is solid at room temperature and has an epoxide value of 0.21 mol/100 g and a phosphorus content of 5.6% by weight.

EXAMPLE 6

102 g of a bisphenol A bisglycidyl ether having an epoxide value of 0.55 mol/100 g and 38 g of 2-methyl-2,5-dioxo-1,2-oxaphospholane (0.28 mol) are charged to a 500 ml five-necked flask fitted with stirrer shaft, dropping funnel, reflux condenser and thermometer, and the mixture is heated at 110° C. with stirring. 15.5 g of resorcinol (0.14 mol) are then added. After stirring at 110° C. for 30 minutes, a clear solution is obtained. Stirring is continued at this temperature for 2 h and at 130° C. for one hour. A colorless epoxy resin is obtained which is solid at room temperature and has an epoxide value of 0.19 mol/100 g and a phosphorus content of 5.6% by weight.

Fire Test

The phosphorus-modified resin was mixed thoroughly with the equivalent amount of dicyandiamide (®Dyhard 100 SF, micronized dicyandiamide, SKW Trostberg AG) and the mixture was cured in a Teflon mold in a drying oven at 150°–180° C. for 4 h. The accelerator used was an imidazole (®Dyhard MI, methylimidazole, SKW Trostberg AG). The testing of the fire behavior was carried out in accordance with the directions of Underwriters Laboratories "Test for Flammability of Plastic Materials—UL 94" in the version of 05.02.1975 on test specimens measuring 127 mm in length, 12.7 mm in width and of various thicknesses. The oxygen index was determined in an apparatus in accordance with ASTM-D 2863-74.

Table 1 shows the results of the fire tests in accordance with UL 94.

| Phosphorus-mod. resin | Dicyan-diamide | Imidazole accelera-tor | Oxygen index | After-burning time | UL 94 class-ification |
|---|---|---|---|---|---|
| 160 g of resin from Example 1 | 3.95 g | 0.34 g | 30.2 | <1', <1' | V-0 |
| 140 g of resin from Example 2 | 3.51 g | 0.29 g | 29.4 | <1', <1' | V-0 |
| 120 g of resin from Example 5 | 3.28 g | 0.28 g | 29.5 | <1', <2' | V-0 |

We claim:

1. A process for preparing phosphorous-modified epoxy resins from an epoxy resin and a phosphorous-containing compound of formula (I)

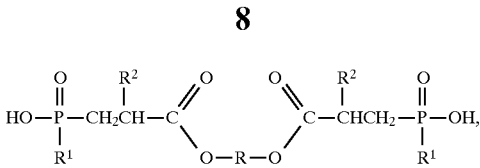

in which R1 is an alkyl or aryl group having from 1 to 10 carbon atoms, R2 is hydrogen or an alkyl group having from 1 to 4 carbon atoms and R is an alkylene, cycloalkylene or arylene group having from 2 to 20 carbon atoms, which comprises reacting a polyepoxide compound having at least two epoxide groups per molecule and diphosphinic acid (I) with one another in a solvent selected from the group consisting of halogenated hydrocarbons, aliphatic, cycloaliphatic and aromatic hydrocarbons, and mixtures thereof, or an aprotic polar solvent selected from the group consisting of N-methylpyrrolidone, di-methylformamide, tetrahydrofuran, dioxane, dialkyl ethers, glycol ethers, ketones, esters and mixtures thereof.

2. The process as claimed in claim 1 wherein said solvent is an aprotic polar solvent selected from the group consisting of N-methylpyrrolidone, di-methylformamide, tetrahydrofuran, dioxane, dialkyl ethers, glycol ethers, ketones, and esters.

3. The process as claimed claim 1, wherein the reaction takes place at temperatures of between −10° and +200° C.

4. The process as claimed in claim 3, wherein the reaction takes place at temperatures of from 70° to 130° C.

5. The process as claimed in claim 1, wherein the ratio of equivalents between polyepoxide compound and diphosphinic acid is from 1:0.1 to 1:1.

* * * * *